United States Patent
Bernstein et al.

(10) Patent No.: US 8,232,190 B2
(45) Date of Patent: Jul. 31, 2012

(54) THREE DIMENSIONAL VERTICAL E-FUSE STRUCTURES AND METHODS OF MANUFACTURING THE SAME

(75) Inventors: Kerry Bernstein, Underhill, VT (US); Timothy J. Dalton, Ridgefield, CT (US); Jeffrey P. Gambino, Westford, VT (US); Mark D. Jaffe, Shelburne, VT (US); Stephen E. Luce, Underhill, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 390 days.

(21) Appl. No.: 11/865,079

(22) Filed: Oct. 1, 2007

(65) Prior Publication Data

US 2009/0085152 A1 Apr. 2, 2009

(51) Int. Cl.
*H01L 21/44* (2006.01)

(52) U.S. Cl. ........ 438/601; 438/656; 438/660; 438/666; 257/529; 257/E23.149

(58) Field of Classification Search .......... 438/658, 438/660, 666, 686, 650; 257/209, 529, E23.149, 257/E21.529
See application file for complete search history.

(56) References Cited

U.S. PATENT DOCUMENTS

| | | | |
|---|---|---|---|
| 5,059,555 A | 10/1991 | Iranmanesh et al. | |
| 5,760,453 A | 6/1998 | Chen | |
| 5,965,927 A * | 10/1999 | Lee et al. | 257/529 |
| 6,025,205 A * | 2/2000 | Park et al. | 438/3 |
| 6,190,986 B1 | 2/2001 | Arndt et al. | |
| 6,218,279 B1 * | 4/2001 | Weber et al. | 438/601 |
| 6,242,789 B1 * | 6/2001 | Weber et al. | 257/529 |
| 6,261,937 B1 | 7/2001 | Többen et al. | |
| 6,278,171 B2 | 8/2001 | Arndt et al. | |
| 6,498,385 B1 | 12/2002 | Daubenspeck et al. | |
| 6,580,144 B2 * | 6/2003 | Anthony | 257/529 |
| 7,217,655 B2 * | 5/2007 | Cabral et al. | 438/642 |
| 2002/0014680 A1 | 2/2002 | Tottori | |
| 2002/0163019 A1 * | 11/2002 | Mohsen | 257/209 |
| 2003/0062595 A1 * | 4/2003 | Anthony | 257/530 |
| 2004/0140501 A1 | 7/2004 | Kim | |
| 2005/0110070 A1 | 5/2005 | Omura | |
| 2007/0181969 A1 * | 8/2007 | Kim et al. | 257/529 |
| 2008/0047583 A1 * | 2/2008 | Fukunaga et al. | 134/3 |
| 2008/0173975 A1 * | 7/2008 | Chen et al. | 257/529 |

\* cited by examiner

*Primary Examiner* — David E Graybill
*Assistant Examiner* — Mark A Laurenzi
(74) *Attorney, Agent, or Firm* — Anthony Canale; Roberts Mlotkowski Safran & Cole, P.C.

(57) ABSTRACT

Three dimensional vertical e-fuse structures and methods of manufacturing the same are provided herein. The method of forming a fuse structure comprises providing a substrate including an insulator layer and forming an opening in the insulator layer. The method further comprises forming a conductive layer along a sidewall of the opening and filling the opening with an insulator material. The vertical e-fuse structure comprises a first contact layer and a second contact layer. The structure further includes a conductive material lined within a via and in electrical contact with the first contact layer and the second contact layer. The conductive material has an increased resistance as a current is applied thereto.

11 Claims, 14 Drawing Sheets

THREE DIMENSIONAL VERTICAL E-FUSE STRUCTURES AND METHODS OF MANUFACTURING THE SAME

FIELD OF THE INVENTION

The invention relates to e-fuse structures and methods of manufacturing the same, and more particularly to three dimensional vertical e-fuse structures and methods of manufacturing the same.

BACKGROUND DESCRIPTION

There is a continued effort to reduce leading edge Integrated Circuit (IC) chip area (by improving the circuit density) for cost, yield, and performance benefits. Current e-fuse structures and manufacturing methodologies are not conducive to these goals.

An exemplary use of fuses in semiconductor devices has been in redundancy technology. Redundancy technology improves the fabrication yield of high-density semiconductor devices, such as static random access memory ("SRAM") devices and dynamic random access memory ("DRAM") devices, by facilitating the substitution of a redundant program circuit for a failed program circuit that could otherwise render the semiconductor device useless. The failed circuit may be bypassed and the redundant circuit activated or programmed by selectively programming, or "blowing" fuses of the semiconductor device.

Fuses are probably the simplest and most compact mechanism of programming a semiconductor memory device. In conventional designs, the fuse includes a conductive layer, typically comprising metal or polysilicon, which is narrowed in one region. To blow the fuse, a high electrical current (programming current) is applied to the fuse which heats the metal or polysilicon of the fuse to a temperature above the melting point which, in turn, "blows" the fuse, i.e., the metal or polysilicon becomes discontinuous, breaking the conductive link across the fuse. In most instances, the fuse becomes discontinuous at the narrowed region since the current density is highest and the temperature increases most quickly at the narrowed region of the fuse.

When a metal fuse is disposed adjacent a doped silicon or doped polysilicon structure to bridge selected regions thereof, the resistance of the adjacent silicon or polysilicon should not differ significantly from the resistance of the fuse. Thus, upon "blowing" the fuse, the adjacent silicon or polysilicon may continue to transmit current similar to the current carried across an intact fuse. This is especially problematic when a fuse is disposed adjacent an n-well, of a semiconductor substrate conductively doped to have a first conductivity type to bridge two separate conductive wells, such as p-wells, of a second conductivity type, opposite the first conductivity type, disposed adjacent the region of first conductivity type. If the fuse "blows" in a manner that leaves a section of a second, or outlet, side of the fuse that overlaps both a p-well and a portion of the common n-well, current may continue to pass into a p-well from a first side of the "blown" fuse, into the n-well, and out of the n-well to the portion of the second side of the "blown" fuse that overlaps the n-well. Thus, a fuse that blows in such a manner may undesirably conduct current having substantially the same characteristics as current conducted across an intact fuse.

SUMMARY OF THE INVENTION

In an aspect of the invention, a method of forming a fuse structure comprises providing a substrate including an insulator layer and forming an opening in the insulator layer. The method further comprises forming a conductive layer along a sidewall of the opening and filling the opening with an insulator material.

In another aspect of the invention, the method comprises forming a first contact on a first level of a structure and a second contact on a second level of the structure. An insulator layer is formed between the first contact and the second contact, and a via is formed in the insulator layer between the first contact and the second contact. The via is lined with a conductive material and filled with an insulator material.

In yet another aspect of the invention, a vertical e-fuse structure comprises a first contact layer and a second contact layer. The structure further comprises a conductive material lined within a via and in electrical contact with the first contact layer and the second contact layer. The conductive material has an increased resistance as a current is applied thereto.

DETAILED DESCRIPTION OF EMBODIMENTS OF THE INVENTION

The invention relates to e-fuse structures and methods of manufacturing the same, and more particularly to three dimensional vertical e-fuse structures and methods of manufacturing the same. More specifically, the invention relates to a number of novel structures and manufacturing methods to form e-fuses in vertical wiring structures (e.g., vias) that improve circuit density in advanced integrated circuits. In embodiments, the three dimensional vertical e-fuse structures of the present invention are created by forming a thin liner in a via hole and filling with an insulator. The e-fuse liner material selection can be diverse, for example, a thin ohmic material that becomes more resistive at high voltages and currents (e.g., CVD silicide). In further embodiments, the vertical via e-fuse structure(s) and methodologies are accomplished with minimal additional processing steps, which maintains overall costs for manufacturing an integrated circuit. The e-fuse of the present invention can be used as a resistor. Additionally, it is possible to add a crack stop (bomb shelter) around the e-fuse. In addition, the e-fuse structures of the invention are not at the conventional e-fuse "silicon gate" level thus resulting in the reduction of used silicon area.

Figure 1:
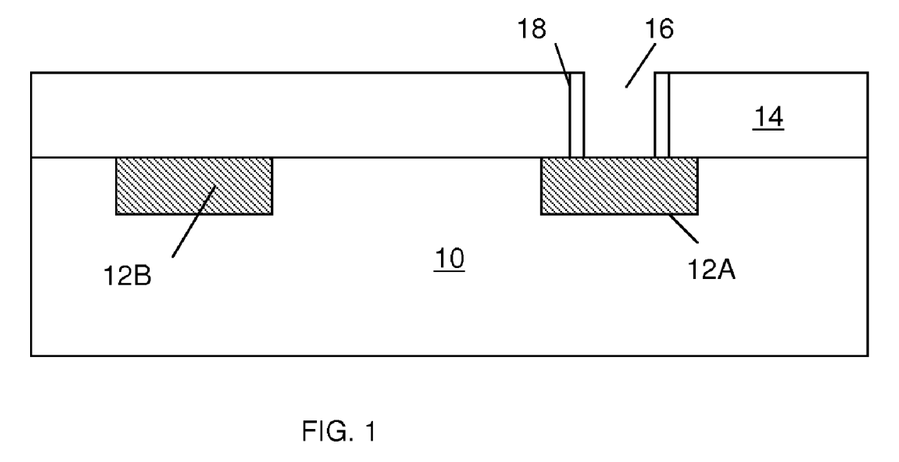
FIG. 1 shows a beginning structure of a first embodiment of an e-fuse structure according to the invention.

FIG. 1 shows a beginning structure of a first embodiment of an e-fuse structure according to the invention. In this beginning structure, a metallization 12a, 12b, at a first level (M1), is formed in a substrate 10 such as, for example, $SiO_2$. The metallization 12a, 12b may be patterned into the substrate 10 in any known, conventional manner. It is understood that the present invention contemplates more than metallization 12a, 12b at any of the levels (M1, M2, etc.); and that the use of metallization 12a, 12b is provided for non-limiting, illustrative purposes and ease of discussion only. Accordingly, one of skill in the art would recognize that the invention can be implemented with more than two metallization at each layer in accordance with the novel aspects of the invention discussed herein. In embodiments, the metallization 12a, 12b is Copper (Cu); although, any known metal layer is contemplated for use with the invention.

A layer 14 is formed over the metallization 12a, 2b and substrate 10. The layer 14 may be an insulator such as, for example, SiCOH, $SiO_2$, fluorinated $SiO_2$, or any of a variety of organic low K dielectrics (interlevel dielectric) known to be used in semiconductor fabrication processes. A via 16 is formed over at least one of the metallization 12a in the layer 14. In embodiments, a thin conductive material 18 may be lined in the via 16, in any known process. The liner 18 may be between about 10 nm to 200 nm, and preferably about 50 nm. As in all of the embodiments discussed herein, the liner 18 electrically connects two wiring layers and, as current is applied to the liner 18, the resistance of the liner 18 will increase such that it will be recognized as an open fuse.

In embodiments, the structure (fuse) of FIG. 1 may be formed by PVD or CVD silicide plus RIE processes. Alternatively, the structure of FIG. 1 may be formed by PVD or CVD Si, plus RIE and salicide processes. Still further, the structure of FIG. 1 may be formed by PVD or CVD metal plus RIE processes. The conductive material of the liner 18 may be, for example, NiSi, $CoSi_2$ or $TiSi_2$ or other known conductive materials such as copper.

Figure 2:
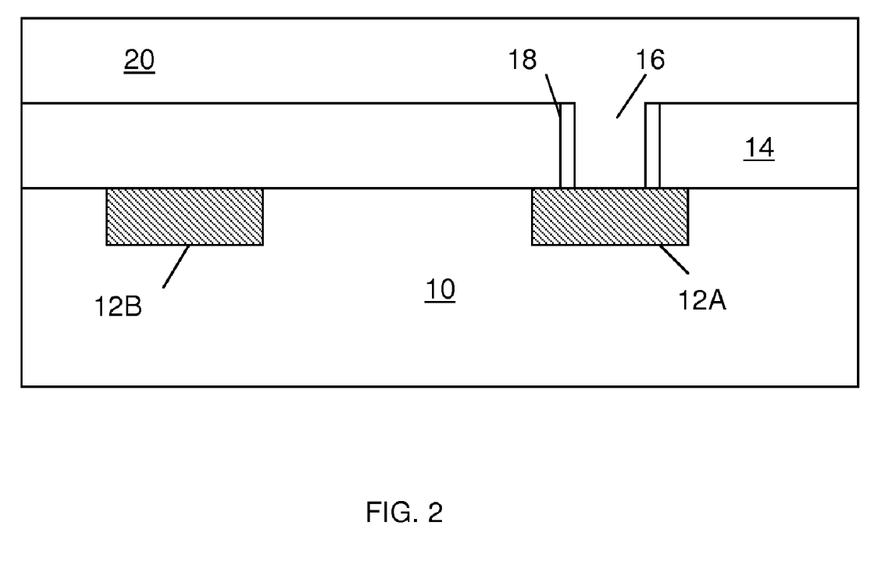
FIGS. 2-5 show fabrication processes of an e-fuse structure according to the first embodiment of the invention.

FIGS. 2-5 show fabrication processes of an e-fuse structure according to the first embodiment of the invention. In FIG. 2, an insulator 20 is deposited over the structure of FIG. 1 in a conventional manner, filling the via 16. The insulator 20 may be SiCOH, $SiO_2$, fluorinated $SiO_2$, or any of a variety of organic low K dielectrics (interlevel dielectric) known to be used in semiconductor fabrication. The insulator 20 is used to electrically separate closely spaced interconnect lines arranged in several levels (multilevel metallization) in an advanced integrated circuit.

Figure 3:
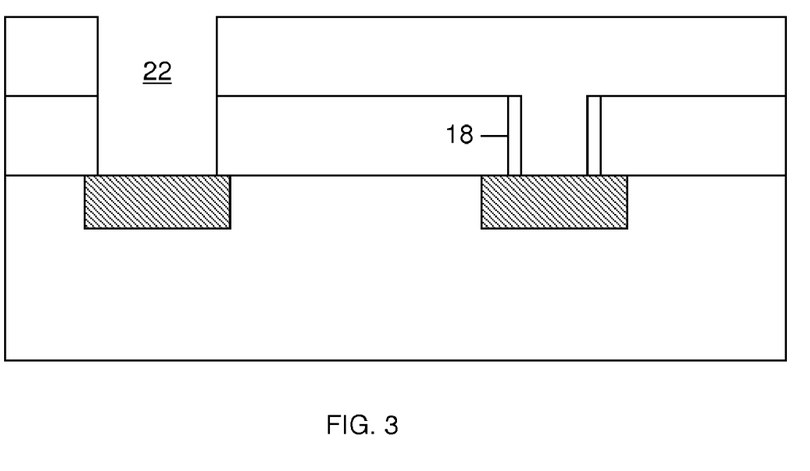
Figure 4:
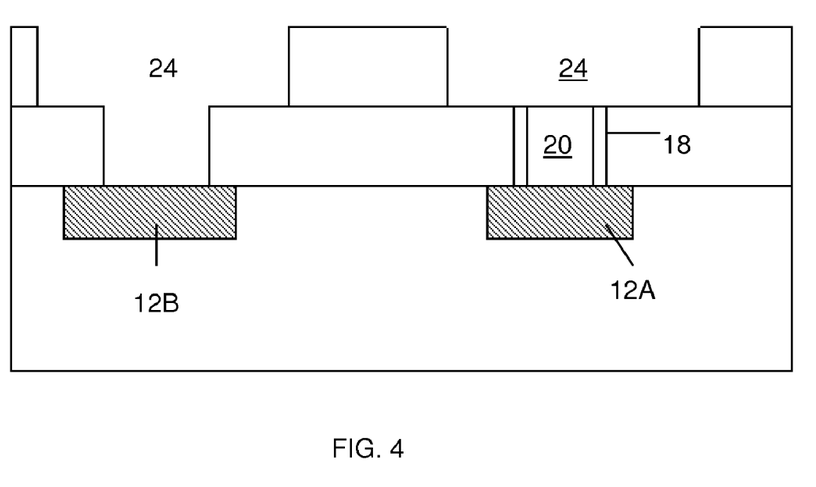
Figure 5:
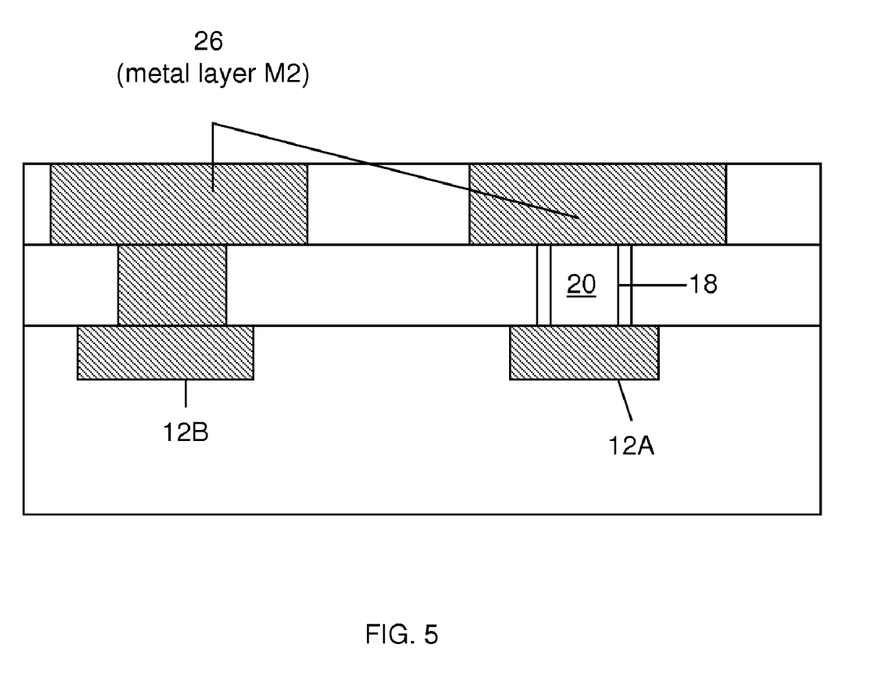

In FIG. 3, a standard via pattern is etched into the insulator 20 and the layer 14 to the metallization 12b to form a via 22. In FIG. 4, the metal pattern (M2) is etched into insulator forming a trench structure 24 (stepped pattern). In FIG. 5, metal 26 is filled within the via 22 and the trench structure 24 to form metal layer M2. Metal layer M2 is electrically connected to metal layer M1, as shown in the figures by the liner 18 in the via 16 or metal interconnect layer. The structure is then planarized using, for example, CMP.

Figure 6:
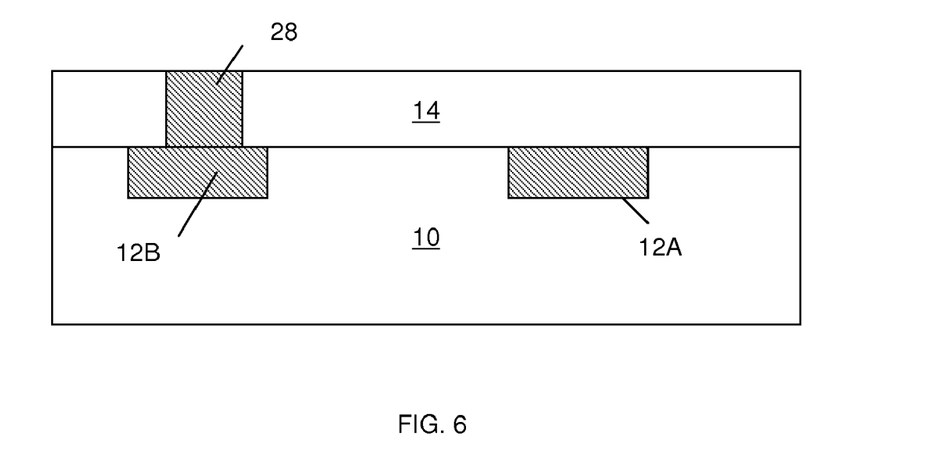
FIG. 6 shows a beginning structure of a second embodiment of an e-fuse structure according to the invention.

FIG. 6 shows a beginning structure of a second embodiment of an e-fuse structure according to the invention. In the beginning structure of FIG. 6, metallization 12a, 12b is formed at a first level M1 in the substrate 10 in any known, conventional manner. In embodiments, the metallization 12a, 12b is copper (Cu); although, any known metal layer is contemplated for use with the invention. A layer 14 is formed over the metallization 12b and is patterned to form a via over the metallization 12b. The via is filled with metal 28 such as, for example, Cu, which will form an interconnect to metal layer M2. The structure is then planarized using, for example, CMP. The layer 14 may be an insulator comprising SiCOH, $SiO_2$, fluorinated $SiO_2$, or any of a variety of organic low K dielectrics (interlevel dielectric) known to be used in semiconductor fabrication.

Figure 7:
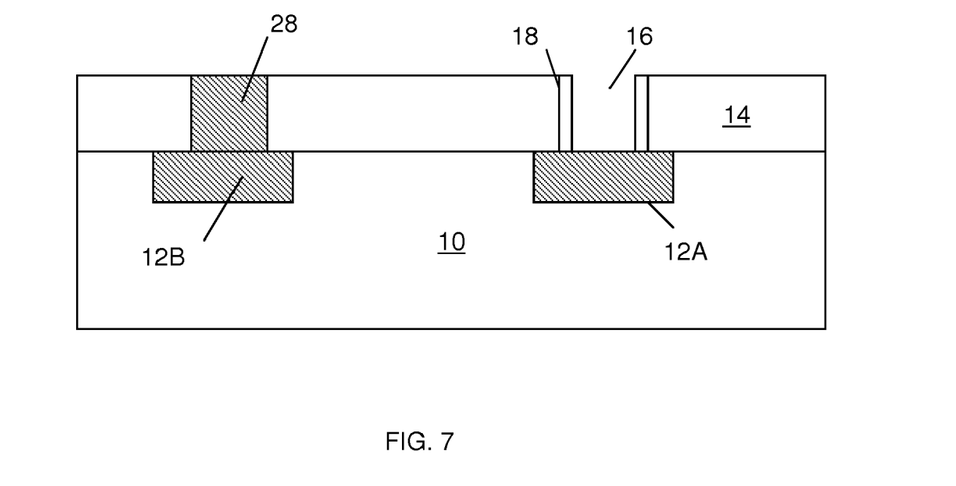
FIGS. 7-9 show fabrication processes of an e-fuse structure according to the second embodiment of the invention.
Figure 8:
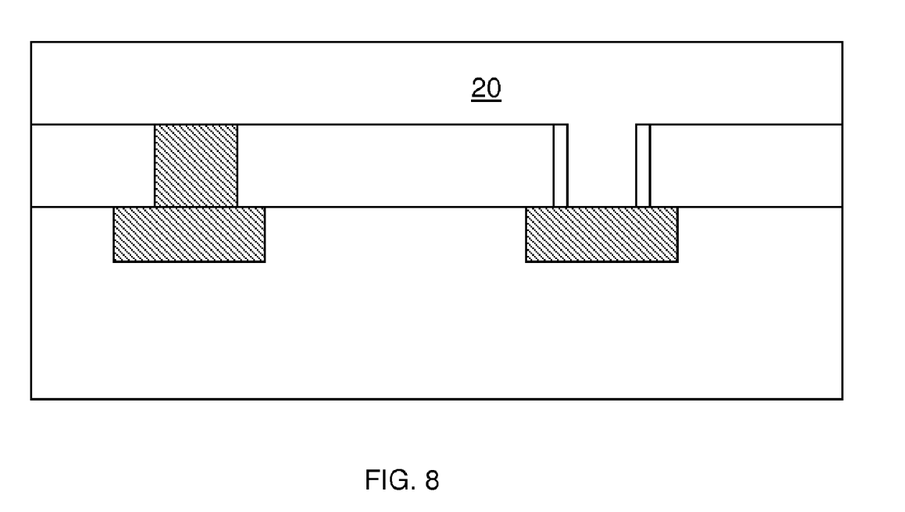
Figure 9:
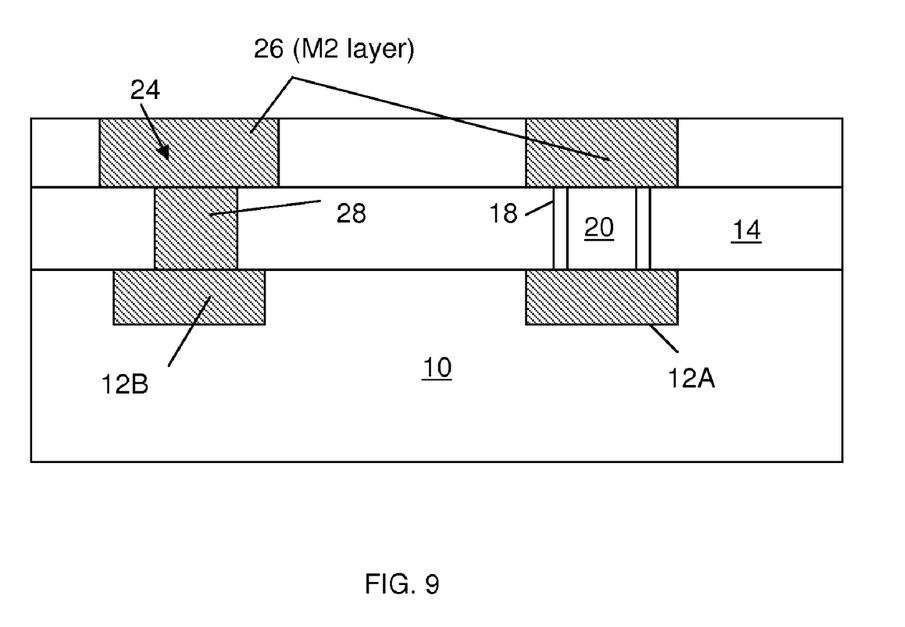

FIGS. 7-9 show fabrication processes of an e-fuse structure according to the second embodiment of the invention. In FIG. 7, a via 16 is formed over at least one of the metallization 12a, in any conventional manner. A thin conductive material 18 may be lined in the via 16. In embodiments, the structure (fuse) of FIG. 7 may be formed by PVD or CVD silicide plus RIE processes. Alternatively, the structure of FIG. 7 may be formed by PVD or CVD Si, plus RIE and salicide processes. Still further, the structure of FIG. 7 may be formed by PVD or CVD metal plus RIE processes. The conductive material of the liner 18 may be, for example, NiSi, $CoSi_2$ or $TiSi_2$ or other known conductive materials such as copper. The liner 18 may be between about 10 nm to 200 nm, and preferably about 50 nm.

In FIG. 8, a deposition process deposits material 20 over the structure, in addition to filling the via 16. This process is performed in any conventional manner. In embodiments, the material 20 may be SiCOH, $SiO_2$, fluorinated $SiO_2$, or any of a variety of organic low K dielectrics (interlevel dielectric) known to be used in semiconductor fabrication.

In FIG. 9, the metal pattern (M2) is etched into material 20 is forming trench structures 24. A metal 26 is filled within the trenches 24 forming a metal layer M2. The structure is then planarized using, for example, CMP. In this embodiment, the metal 26 will contact the underlying metallization 12b via the metal 28. In addition, the metal 26 will contact the underlying metallization 12a via the liner 18 (fuse structure).

Figure 10:
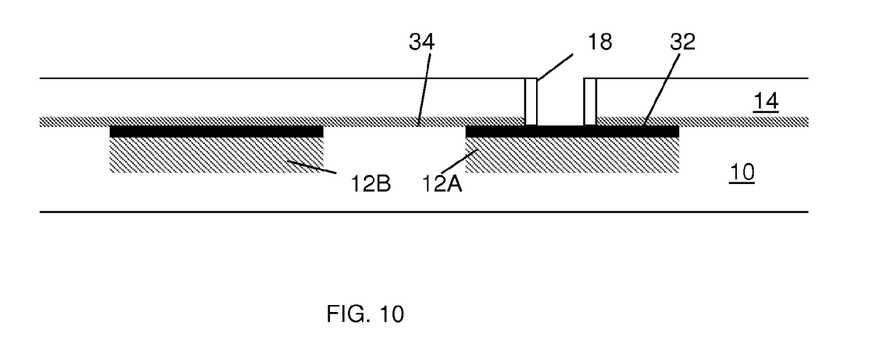
FIG. 10 shows a beginning structure of a third embodiment of an e-fuse structure according to the invention.

FIG. 10 shows a beginning structure of a third embodiment of an e-fuse structure according to the invention. In this structure, a CoWP layer 32 is formed in contact with the metallization 12a, 12b. In this embodiment, the CoWP layer 32 protects the metal layer (e.g., Cu) during M2 dielectric deposition. A SiN layer 34 is formed over the entire structure. The thin conductive material 18 is provided within an etched pattern of the layer 14, using conventional processes, as discussed above. The layer 14 may be an insulator as discussed above. In this embodiment, the liner 18 may be, for example, NiSi, $CoSi_2$ or $TiSi_2$ or other known conductive materials such as copper. The liner 18 may be between about 10 nm to 200 nm, and preferably about 50 nm, and extends to the CoWP layer 32, which is over the metallization 12a.

In embodiments, the structure (fuse) of FIG. 10 may be formed by PVD or CVD silicide plus RIE processes. Alternatively, the structure of FIG. 10 may be formed by PVD or CVD Si, plus RIE and salicide processes. Still further, the structure of FIG. 10 may be formed by PVD or CVD metal plus RIE processes.

Figure 11:
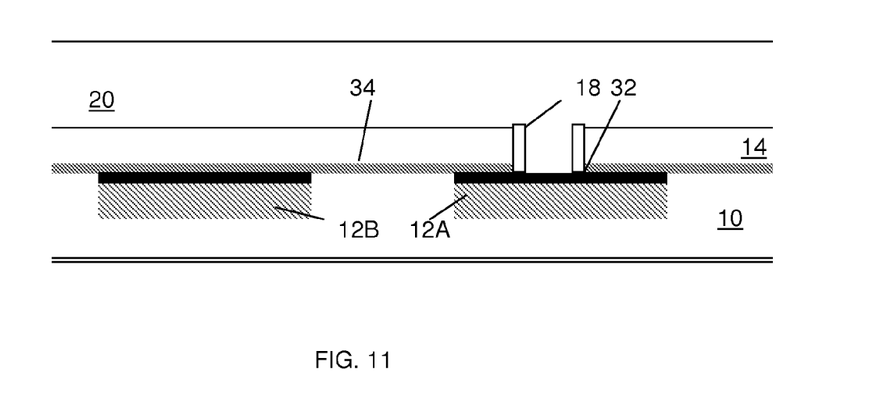
FIGS. 11-14 show fabrication processes of an e-fuse structure according to the third embodiment of the invention.

FIGS. 11-14 show fabrication processes of an e-fuse structure according to the third embodiment of the invention. In FIG. 11, an insulator 20 is deposited over the structure of FIG. 10 in a conventional manner. The insulator 20 may, for example, SiCOH, $SiO_2$, fluorinated $SiO_2$, or any of a variety of organic low K dielectrics (interlevel dielectric) known to be used in semiconductor fabrication.

Figure 12:
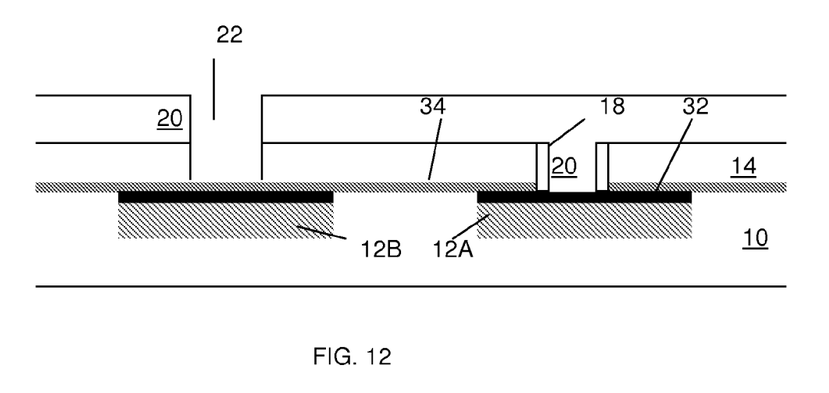
Figure 13:
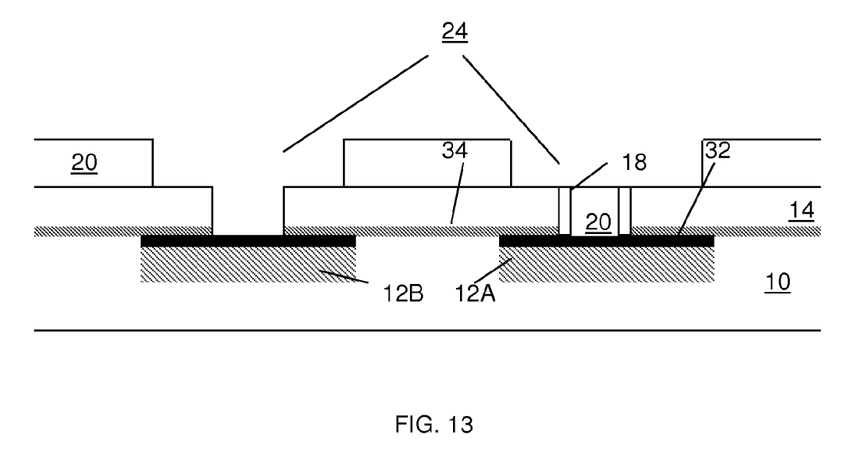
Figure 14:
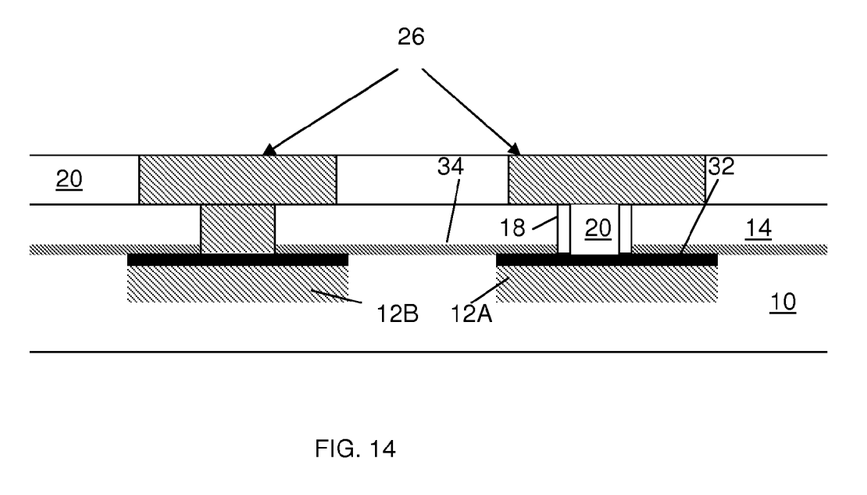

In FIG. 12, a via 22 is patterned to the SiN layer 34, on the side of the metallization 12a. In FIG. 13, a trench 24 is formed in the insulator 20 aligned with or over metallization 12a, 12b. Subsequently, in FIG. 14, a metal layer 26 (M2 level) is formed over the structure, similar to that described with reference to FIG. 5. As in the previous embodiments, the liner 18 will act as a fuse by the application of a high current being passed therethrough. The structure is then planarized using, for example, CMP.

Figure 15:
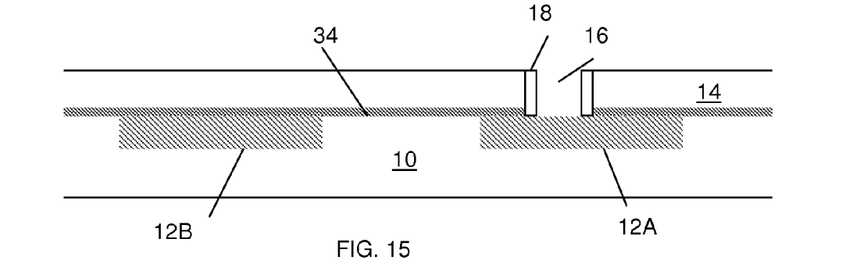
FIG. 15 shows a beginning structure of a fourth embodiment of an e-fuse structure according to the invention.

FIG. 15 shows a beginning structure of a fourth embodiment of an e-fuse structure according to the invention. In this structure, an SiN layer 34 is formed over the structure. The liner 18 is provided within the via 16, extending to and making contact with the underlying metallization 12a. As in the embodiment of FIGS. 10-14, the structure (fuse) of FIG. 15 may be formed by PVD or CVD silicide plus RIE processes. Alternatively, the structure of FIG. 15 may be formed by PVD or CVD Si, plus RIE and salicide processes. Still further, the structure of FIG. 15 may be formed by PVD or CVD metal plus RIE processes. The materials for use as the liner 18 may be, for example, NiSi, $CoSi_2$ or $TiSi_2$.

Figure 16:
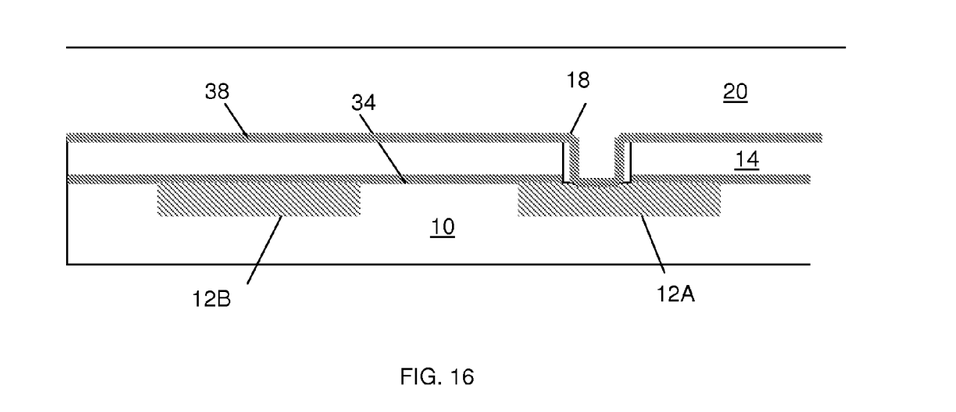
FIGS. 16-19 show fabrication processes of an e-fuse structure according to the fourth embodiment of the invention.

FIGS. 16-19 show fabrication processes of an e-fuse structure according to the fourth embodiment of the invention. In FIG. 16, an SiN layer 38 is deposited (e.g., conformally formed) over the structure in any conventional manner. In this embodiment, the SiN layer 38 protects the metal layer M1 during M2 dielectric deposition. An insulator 20 is formed over the SiN layer 38. Again, the insulator 20 may be, for example, SiCOH, $SiO_2$, fluorinated $SiO_2$, or any of a variety of organic low K dielectrics (interlevel dielectric) known to be used in semiconductor fabrication.

Figure 17:
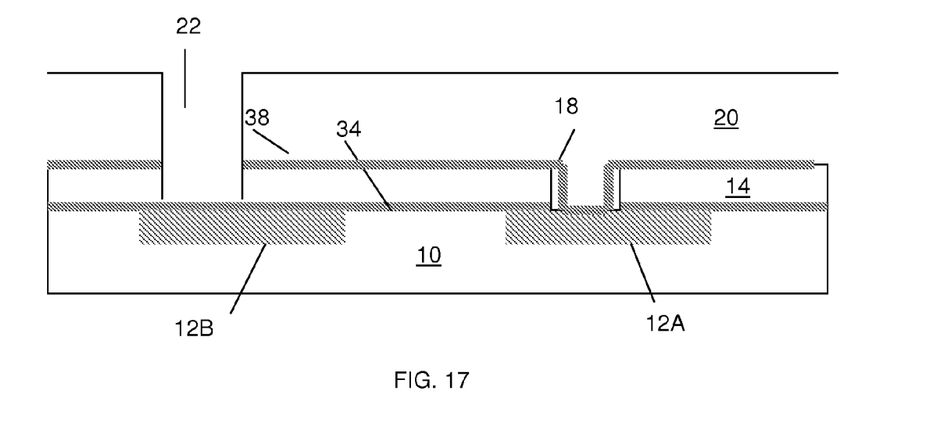
Figure 18:
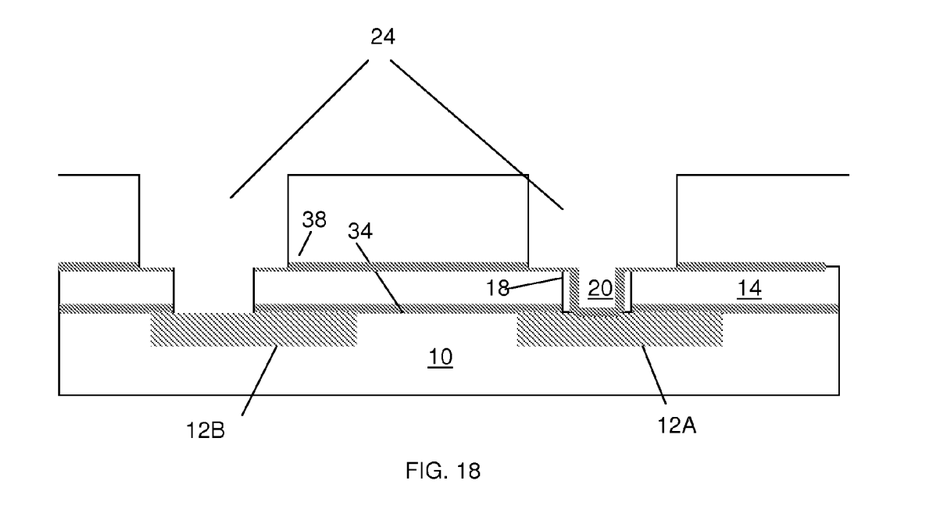
Figure 19:
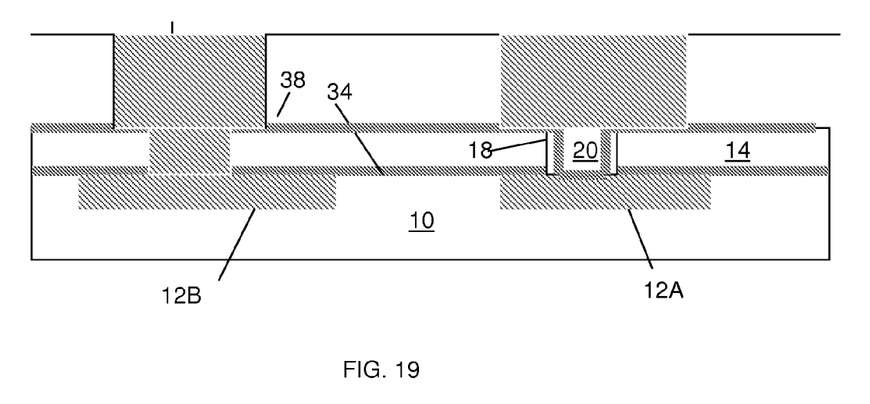

In FIG. 17, a via 22 is patterned to the SiN layer 34, on the side of the metallization 12b. In FIG. 18, a trench 24 is formed in the insulator 20 aligned with or over both metallization 12a, 12b. Subsequently, in FIG. 19, a metal layer 26 (M2 level) is formed over the structure, similar to that described with reference to FIG. 5. As in the previous embodiments, the liner 18 will act as a fuse by the application of a high current being passed therethrough. The structure is then planarized using, for example, CMP.

Figure 20:
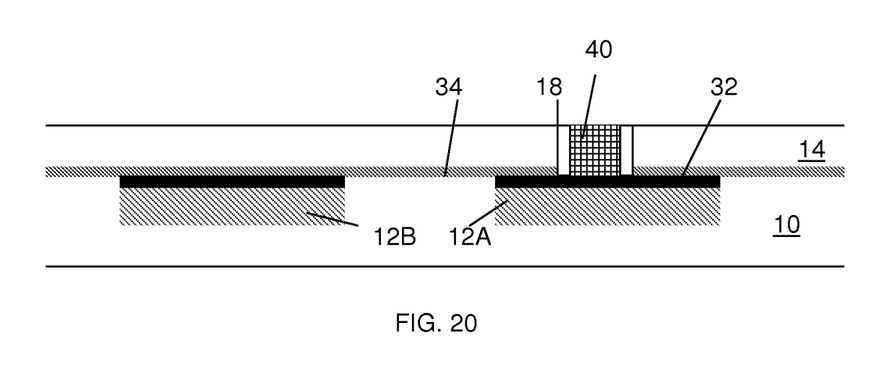
FIG. 20 shows a beginning structure of a fifth embodiment of an e-fuse structure according to the invention.

FIG. 20 shows a beginning structure of a fifth embodiment of an e-fuse structure according to the invention. In this structure, a CoWP layer 32 is formed in contact with the metallization 12a, 12b. A SiN layer 34 is formed over the entire structure. A liner 18 is provided within an etched pattern of the layer 14, using conventional processes. For example, the structure (fuse) of FIG. 20 may be formed by PVD or CVD silicide plus RIE processes. Alternatively, the structure of FIG. 7 may be formed by PVD or CVD Si, plus RIE and salicide processes. Still further, the structure of FIG. 20 may be formed by PVD or CVD metal plus RIE processes. The conductive material of the liner 18 may be, for example, NiSi, $CoSi_2$ or $TiSi_2$ or other known conductive materials such as copper. The liner 18 may be between about 10 nm to 200 nm, and preferably about 50 nm.

A low K material 40 such as, for example, SiCOH fills the via over the metallization 12a. In this embodiment, the low k material reduces fuse programming voltage or current by providing a low modulus cap layer of the fuse material (i.e., agglomeration temperature of the metal is reduced). Thus, as should be understood by those of skill in the art, the low modulus material 40 allows the liner 18 to move more easily thus increasing its use as a fuse.

Figure 21:
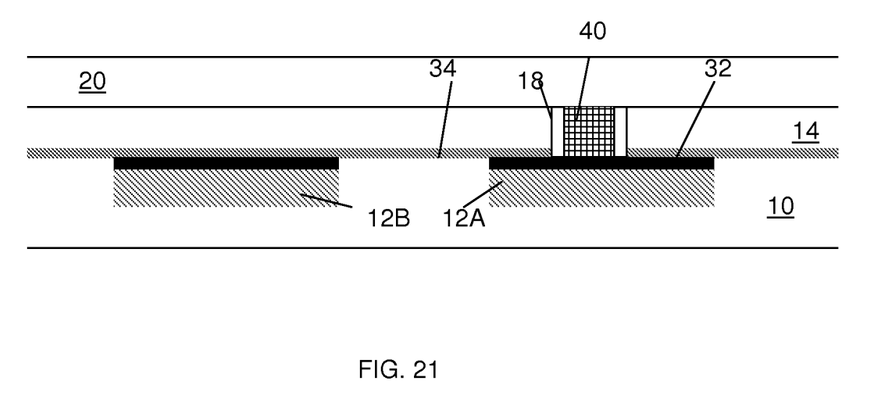
FIGS. 21-24 show fabrication processes of an e-fuse structure according to the fifth embodiment of the invention.

FIGS. 21-24 show fabrication processes of an e-fuse structure according to the fifth embodiment of the invention. In FIG. 21, an insulator 20 is deposited over the structure of FIG. 20 in any conventional manner. Again, the insulator 20 may be, for example, SiCOH, $SiO_2$, fluorinated $SiO_2$, or any of a variety of organic low K dielectrics known to be used in semiconductor fabrication.

Figure 22:
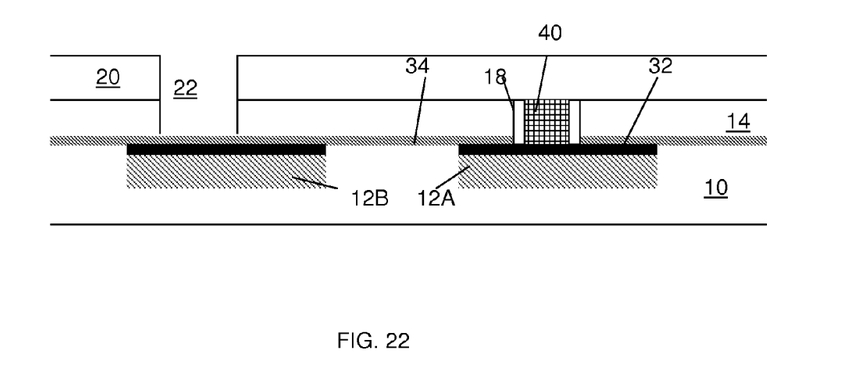
Figure 23:
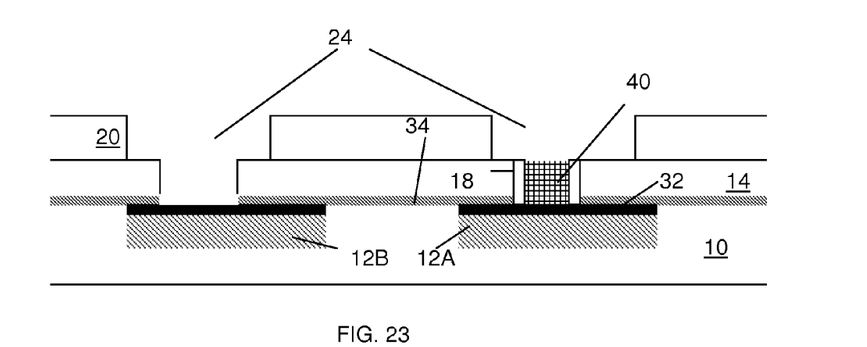
Figure 24:
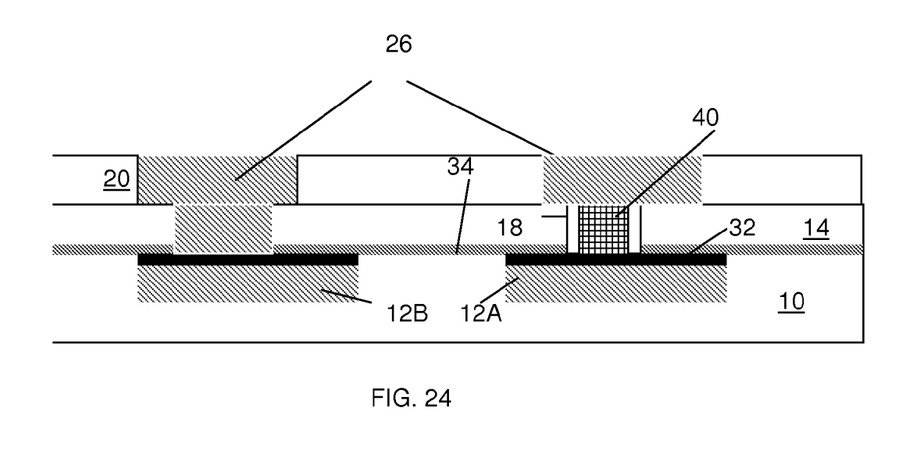

In FIG. 22, a via 22 is patterned to the SiN layer 34, aligned with or over the metallization 12b. In FIG. 23, a trench 24 is formed in the insulator 20, aligned with or over both metallization 12a, 12b. Subsequently, in FIG. 24, a metal layer 26 (M2 level) is formed in the trenches 24, similar to that described with reference to FIG. 5. The metal layer 26 is in electrical contact with metallization 12a, 12b, by the mechanisms shown and described herein, e.g., via metal and liner. The structure is planarized using, for example, CMP.

The method as described herein is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It is noted that the foregoing examples have been provided merely for the purpose of explanation and are in no way to be construed as limiting of the present invention. While the present invention has been described with reference to an exemplary embodiment, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

It is claimed:

1. A method, comprising:
   forming a first contact and a second contact in a substrate;
   forming an insulator layer over and in physical contact with the substrate, the first contact, and the second contact;
   etching a first via through the insulator layer to expose the first contact;
   lining sidewalls of the via with a conductive material which makes physical contact with the first contact;
   forming an insulator material over and in physical contact with the insulator layer and within the via thereby forming the insulator material over and in physical contact with conductive material;
   etching a second via through the insulator material and the insulator layer to expose the second contact;
   etching a first trench and a second trench through the insulator material in a same processing step, the first trench being aligned with the first via, and the second being aligned with the second via; and
   filling the second via, the first trench, and the second trench with a conductive metal in a same processing step, the conductive metal being in physical contact with the second contact, the insulator layer, the conductive material, and the insulator material.

2. A method of forming a fuse structure comprising:
   providing a substrate including an insulator layer;
   forming an opening in the insulator layer;
   forming a conductive layer along a sidewall of the opening;
   forming a first contact layer adjacent to a lower surface of the insulator layer coupled to a first end of the conductive layer;

forming a second contact layer adjacent to an upper surface of the insulator layer coupled to a second end of the conductive layer;

depositing an insulator material within the opening and in contact with the first contact layer;

depositing a CoWp layer in contact with the first contact layer; and depositing a SiN layer over the CoWp layer, wherein the opening extends to the CoWp layer;

wherein:

the insulator layer is deposited over and in physical contact with the SiN layer;

the opening is formed through the insulator layer and the SiN layer in a same processing step to expose the CoWp layer;

the first end of the conductive layer is in physical contact with the CoWp layer;

the method further comprises:

forming a third contact layer adjacent to the lower surface of the insulator layer and the first contact layer, in the substrate;

forming a second CoWp layer over and in physical contact with the third contact layer;

forming a via adjacent to the opening, the via being formed through the insulator material, the insulator layer, and the SiN layer to expose the second CoWp layer; and forming a first trench aligned with the opening and a second trench aligned with the via in a same processing step, wherein the first trench and the second trench are formed through the insulator material and extend to the insulator layer; and the second contact layer is formed in the via, the first trench, and the second trench in a same processing step, the second contact layer being in physical contact with the insulator layer, the conductive layer, the insulator material, the SiN layer, and the second CoWp layer.

3. The method of claim 1, wherein the insulator layer is an inter-level dielectric.

4. The method of claim 1, wherein the insulator material is a low-k dielectric material.

5. The method of claim 1, wherein the conductive layer lines the opening.

6. The method of claim 5, wherein the conductive layer has a thickness of about 10 nm to about 200 nm.

7. The method of claim 1, wherein the conductive layer is one of NiSi, $CoSi_2$ and $TiSi_2$.

8. The method of claim 1, wherein the insulator material is a low modulus cap layer.

9. The method of claim 1, wherein the insulator layer and the insulator material is at least one of SiCOH, $SiO_2$ and fluorinated $SiO_2$.

10. The method of claim 1, further comprising lining the opening with a protective film.

11. A method of forming a fuse structure comprising:

providing a substrate including an insulator layer;

forming an opening in the insulator layer;

forming a conductive layer along a sidewall of the opening;

forming a first contact layer adjacent to a lower surface of the insulator layer coupled to a first end of the conductive layer;

forming a second contact layer adjacent to an upper surface of the insulator layer coupled to a second end of the conductive layer;

depositing an insulator material within the opening and in contact with the first contact layer;

depositing a SiN layer in contact with the first contact layer; and depositing a second SiN layer extending into the via and in contact with the first contact layer, the second SiN layer is further deposited on the insulator layer, wherein:

the insulator layer is deposited over and in physical contact with the SiN layer;

the opening is formed through the insulator layer and the SiN layer in a same processing step to expose the first contact layer;

the method further comprises:

forming a third contact layer adjacent to the lower surface of the insulator layer and the first contact layer, in the substrate;

forming a via adjacent to the opening, the via being formed through the insulator material, the second SiN layer, the insulator layer, and the SiN layer to expose the third contact layer;

forming a first trench aligned with the opening and a second trench aligned with the via in a same processing step, wherein the first trench and the second trench are formed through the insulator material; and the second contact layer is formed in the via, the first trench, and the second trench in a same processing step, the second contact layer being in physical contact with the insulator layer, the conductive layer, the insulator material, the SiN layer, the second SiN layer, and the third contact layer.

* * * * *